US012631453B2

(12) United States Patent
Chong et al.

(10) Patent No.: US 12,631,453 B2
(45) Date of Patent: May 19, 2026

(54) INERTIAL SENSOR AND METHOD FOR FORMING THE SAME

(71) Applicant: AAC Technologies Pte. Ltd., Singapore (SG)

(72) Inventors: Houming Chong, Johor (MY); Veronica Tan, Singapore (SG); ZaiXiang Pua, Singapore (SG); Kahkeen Lai, Singapore (SG); Zhan Zhan, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 301 days.

(21) Appl. No.: 18/335,991

(22) Filed: Jun. 15, 2023

(65) Prior Publication Data

US 2024/0418510 A1 Dec. 19, 2024

(51) Int. Cl.
| | |
|---|---|
| *G01C 21/16* | (2006.01) |
| *B81B 3/00* | (2006.01) |
| *B81C 1/00* | (2006.01) |

(52) U.S. Cl.
CPC ............ *G01C 21/16* (2013.01); *B81B 3/0021* (2013.01); *B81C 1/00166* (2013.01); *B81B 2201/0221* (2013.01); *B81B 2201/0235* (2013.01); *B81B 2203/0315* (2013.01); *B81B 2203/04* (2013.01); *B81C 2201/0197* (2013.01); *B81C 2203/037* (2013.01)

(58) Field of Classification Search
None
See application file for complete search history.

(56) References Cited

U.S. PATENT DOCUMENTS

| | | | | |
|---|---|---|---|---|
| 8,866,238 B2 * | 10/2014 | Classen | .............. | B81C 1/00246 257/E21.247 |
| 2013/0285165 A1 * | 10/2013 | Classen | .............. | B81C 1/00246 257/415 |
| 2014/0015123 A1 * | 1/2014 | Bowles | ................ | B81B 7/0077 257/737 |
| 2015/0128703 A1 * | 5/2015 | Kaelberer | ............ | B81B 7/0048 73/514.01 |
| 2016/0116286 A1 * | 4/2016 | Nishizawa | ............ | B81B 3/0086 257/415 |
| 2016/0368763 A1 * | 12/2016 | Gonska | .................... | B81B 7/02 |

* cited by examiner

*Primary Examiner* — Mark A Shabman
(74) *Attorney, Agent, or Firm* — Viersch Law Group

(57) ABSTRACT

An inertial sensor and a method therefor. The inertial sensor includes: a first substrate; a medium layer stacked on the first substrate; a first electric-conductive layer stacked on the medium layer, first openings being formed in the first electric-conductive layer and spaced from one another; second electric-conductive layers being bonded to the first electric-conductive layer through bonding structures, a gap being formed between adjacent second electric-conductive layers, which are connected to each other by a connection part, and second openings being formed in each of the second electric-conductive layers and spaced from one another; and a second substrate covering the first substrate, a closed space being formed between the second substrate and the first substrate. Compared with a traditional single-layer structure, the die size is reduced, the manufacturing cost is reduced, and the integration of device into portable consumer applications is improved, and XY axis sensitivity is improved.

8 Claims, 2 Drawing Sheets

INERTIAL SENSOR AND METHOD FOR FORMING THE SAME

TECHNICAL FIELD

The present invention relates to the technical field of micro-electro mechanical systems, and in particular, to an inertia sensor and a method for forming the inertia sensor.

BACKGROUND

In the related art, an inertia sensor includes a movable electric-conductive structure and an immovable electric-conductive structure opposite to each other. When the movable electric-conductive structure is displaced, a distance between the movable electric-conductive structure and the immovable electric-conductive structure is changed, so that a capacitance signal in a corresponding direction can be detected, thereby achieving detection of the inertia.

The inertia sensor has a continuous improvement in the performance and smaller die size to enhance user experience and new application. By reducing chip size without stacked device structure, the movable electric-conductive structure tends to reduce a contact area and cause the performance of sensor to decrease.

SUMMARY

In an aspect, the present invention provides an inertial sensor, including: a first substrate; a medium layer stacked on the first substrate; a first electric-conductive layer stacked on the medium layer, first openings being formed in the first electric-conductive layer, and the first openings being spaced apart from one another and are arranged along a radial direction of the first electric-conductive layer; second electric-conductive layers, the second electric-conductive layers being bonded to the first electric-conductive layer through bonding structures, from bottom to top, a gap being formed between adjacent ones of the second electric-conductive layers, and adjacent ones of the electric-conductive layers being connected to each other by a connection part, and second openings being formed in each of the second electric-conductive layers, and the second openings being spaced apart from one another and are arranged along a radial direction of each of the second electric-conductive layers; and a second substrate covering the first substrate, a closed space being formed between the second substrate and the first substrate.

As an improvement, the connection part includes first connectors, the first connectors are spaced apart from one another and are arranged along a radial direction of each of the second electric-conductive layers, and two ends of each of the first connectors are connected two adjacent ones of the second electric-conductive layers.

As an improvement, positions of the first connectors correspond to positions of the bonding structures, respectively.

As an improvement, connection part further includes second connectors, the second connectors are spaced apart from one another and are arranged along a radial direction of each of the second electric-conductive layers, two ends of each of the second connectors are connected to two adjacent ones of the second electric-conductive layers, and a width of each of the second connectors is smaller than a width of each of the first connectors.

As an improvement, the second connectors are arranged adjacent to an edge of the second electric-conductive layers.

As an improvement, each of the first connectors and the second connectors is formed by a conductive material.

As an improvement, the connection part is bonded and fixed to the second electric-conductive layers.

As an improvement, the bonding structures include a first bonding layer and a second bonding layer that are bonded to each other, the first bonding layer is stacked at a top of the first electric-conductive layer, and the second bonding layer is stacked at a bottom of the second electric-conductive layers.

As an improvement, a surface of the second substrate facing the first substrate is recessed to form a recess.

In another aspect, the present invention provides a method for forming an inertial sensor. The inertial sensor includes: a first substrate; a medium layer stacked on the first substrate; a first electric-conductive layer stacked on the medium layer, first openings being formed in the first electric-conductive layer, and the first openings being spaced apart from one another and are arranged along a radial direction of the first electric-conductive layer; second electric-conductive layers, the second electric-conductive layers being bonded to the first electric-conductive layer through bonding structures, from bottom to top, a gap being formed between adjacent ones of the second electric-conductive layers, and adjacent ones of the electric-conductive layers being connected to each other by a connection part, and second openings being formed in each of the second electric-conductive layers, and the second openings being spaced apart from one another and are arranged along a radial direction of each of the second electric-conductive layers; and a second substrate covering the first substrate, a closed space being formed between the second substrate and the first substrate. The method includes: forming one of the second electric-conductive layers on the second substrate, and forming the second openings in the second electric-conductive layer; depositing a sacrificial layer on the one of the second electric-conductive layers; forming another one layer of the second electric-conductive layers on the sacrificial layer, and forming the second openings in the another one of the second electric-conductive layers; connecting the one layer of the second electric-conductive layers and the another one layer of the second electric-conductive layers by using the connection part; forming a second bonding layer on the second electric-conductive layers; forming the medium layer and the first electric-conductive layer on the first substrate, and forming the first openings in the first electric-conductive layer; forming a first bonding layer on the first electric-conductive layer; bonding the first bonding layer and the second bonding layer together at a high temperature, and forming a closed space between the second substrate and the first substrate; and removing the sacrificial layer.

REFERENCE NUMERALS

Figure 1:
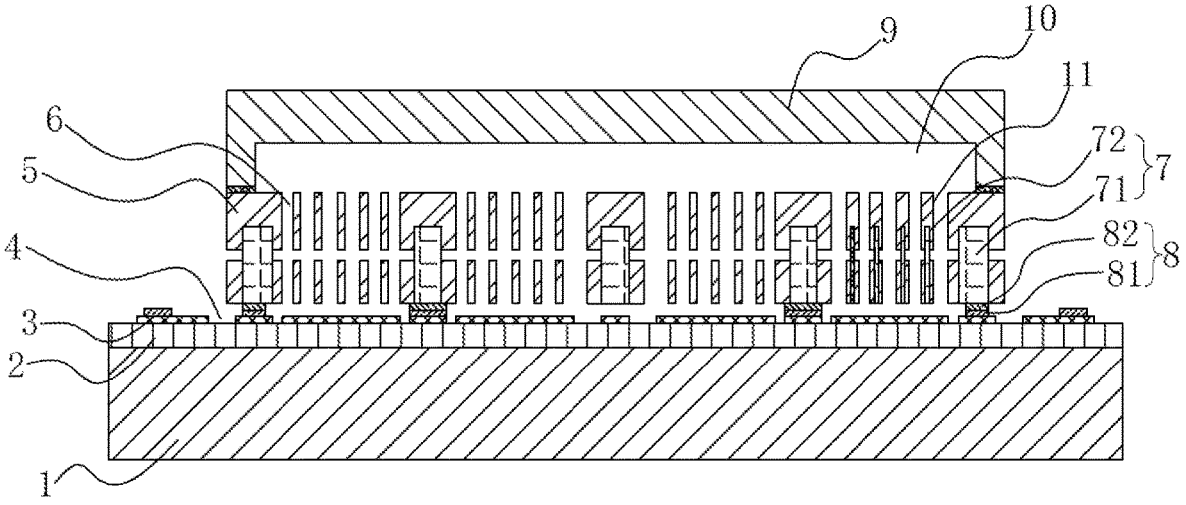
FIG. 1 is a schematic cross-sectional view of an inertia sensor according to an embodiment of the present invention.

1: first substrate
2: medium layer
3: first electric-conductive layer

4: first opening
5: second electric-conductive layer
6: second opening
7: connection part
   71: first connector
   72: second connector
8: bonding structure
   81: first bonding layer
   82: second bonding layer
9: second substrate
10: recess
11: movable mass block
12: sacrificial layer

DESCRIPTION OF EMBODIMENTS

The embodiments described below by referring to the figures are exemplary merely for illustrating the present invention and should not be illustrated as limiting the present invention.

As shown in FIG. 1, an embodiment of the present invention provides an inertia sensor, including: a first substrate 1, a medium layer 2, a first electric-conductive layer 3, bonding structures 8, second electric-conductive layers 5 and a second substrate 9 arranged sequentially from bottom to top.

The first substrate 1 is a semiconductor substrate, such as a silicon substrate. In an implementation manner, the first substrate 1 has a circular shape. Those skilled in the art should know that the first substrate 1 may also have other shapes, such as square, etc., which is not limited herein.

The medium layer 2 is stacked on the first substrate 1. A shape of the medium layer 2 is adapted to the shape of the first substrate 1. The medium layer 2 is configured to support the first electric-conductive layer 3, and to achieve electrical isolation between the first electric-conductive layer 3 and the first substrate 1. In an implementation manner, the medium layer 2 is formed by silicon dioxide.

The first electric-conductive layer 3 is stacked on the medium layer 2. A shape of the first electric-conductive layer 3 is adapted to the shape of the medium layer 2. First openings 4 are formed in the first electric-conductive layer 3. Each of the first openings 4 has an annular groove structure. The first openings 4 are spaced apart from one another and are arranged with an axis of the first electric-conductive layer 3 as a center. Adjacent first openings 4 may have a same inner diameter or different inner diameters, which is not limited herein. The first electric-conductive layer 3 is formed by an electric-conductive material, such as polysilicon.

The second electric-conductive layers 5 are bonded to the first electric-conductive layer 3 through the bonding structures 8. From bottom to top, a gap is formed between adjacent second electric-conductive layers 5, thereby providing a space for the second electric-conductive layer 5 to deform. Adjacent second electric-conductive layers 5 are connected to each other by a connection part 7. Second openings 6 are formed in each of the second electric-conductive layers 5. Each of the second openings 6 has an annular groove structure, and the second openings 6 are spaced from one another and are arranged with an axis of the second electric-conductive layer 5 as a center. Adjacent second openings 4 may have a same inner diameter or different inner diameters, which is not limited herein. The second electric-conductive layer 3 is formed by an electric-conductive material, such as polysilicon.

The second substrate 9 covers the first substrate 1. The second substrate 9 is a semiconductor substrate, such as a silicon substrate. In an implementation manner, the second substrate 9 has a circular shape. Those skilled in the art should know that the second substrate 9 may also have other shapes, such as square, etc., which is not limited herein. A closed space is formed between the second substrate 9 and the first substrate 1, so that an internal structure of the inertia sensor can be prevented from being disturbed by the external environment. Therefore, it is convenient to control an air pressure in the cavity, thereby improving the working stability.

In the embodiments described above, at least two second electric-conductive layers 5 are provided. Compared with a traditional single-layer structure, the die size is reduced, the manufacturing cost is reduced, and the integration of device into portable consumer applications is improved. Moreover, a larger movable electric-conductive structure has a larger surface area, which can improve XY axis sensitivity.

Further, the connection part 7 includes first connectors 71. The first connectors 71 are spaced apart from one another along a radial direction of the second electric-conductive layer 5. Two ends of each of the first connectors 71 are connected to two adjacent second electric-conductive layers 5. The first connectors 71 can achieve functions such as supporting, fixation and electrical connection. In a horizontal direction, a preset distance is formed between adjacent first connectors 71; and in a vertical direction, a gap is formed between adjacent second electric-conductive layers 5, thereby providing a space for the second electric-conductive layer 5 to deform.

In an implementation manner, as shown in FIG. 1, positions of the first connectors 71 correspond to positions of the bonding structures 8, respectively. A cavity is formed between adjacent bonding structures 8, and the second electric-conductive layer 5 located above the cavity is a movable mass block 11. When the movable mass block 11 is displaced, a distance between the movable mass block 11 and the first electric-conductive layer 3 is changed, so that a capacitance signal in the corresponding direction can be detected, thereby achieving detection of the inertia. From bottom to top, a connection position of the first connector 71 corresponds to the position of the bonding structure 8, so that a displacement process of the movable mass block 11 of each of the second electric-conductive layers 5 will tend to be consistent, so that the sensitivity and reliability of the inertial sensor can be effectively improved.

With reference to FIG. 1, the connection part 7 further includes second connectors 72. The second connectors 72 are spaced apart from one another along the radial direction of the second electric-conductive layer 5. Two ends of each of the second connectors 72 are connected to two adjacent second electric-conductive layers 5. A width of each of the second connectors 72 is smaller than a width of each of the first connectors 71. On one hand, the second connectors 72 can improve the connection reliability between two adjacent second electric-conductive layers 5; and on the other hand, the width of each of the second connectors 72 is smaller than the width of each of the first connectors 71, and the second electric-conductive layer 5 can form a larger surface area, so that the flexibility of the second electric-conductive layer 5 is better guaranteed.

Further, as shown in FIG. 1, the second connectors 72 are arranged adjacent to an edge of the second electric-conductive layer 5. The deflection of the second electric-conductive layer 5 is parabolic, that is, the deflection of the second electric-conductive layer 5 is the largest at a center position and is smaller at an edge position. The second connectors 72 are located at the position where the second electric-conductive layer 5 has the smallest displacement, so that the sensitivity of the inertial sensor can be improved.

In the embodiments of the present invention, each of the first connector 71 and the second connector 72 is formed by a conductive material, such as polysilicon. The connection part 7 is glued and fixed to the second electric-conductive layer 5. In this way, manufacture thereof is simple, and the device structure can continue stack up to two or more layers.

With Reference to FIG. 1, the bonding structure 8 includes a first bonding layer 81 and a second bonding layer 82 connected to each other by bonding. The first bonding layer 81 is stacked at the top of the first electric-conductive layer 3. The second bonding layer 82 is stacked at the bottom of the second electric-conductive layer 5. Each of the first bonding layer 81 and the second bonding layer 82 has a ring structure. Each of the first bonding layer 81 and the second bonding layer 82 is formed by a metal material, to form metal thermos-compression bonding.

Figure 2A:
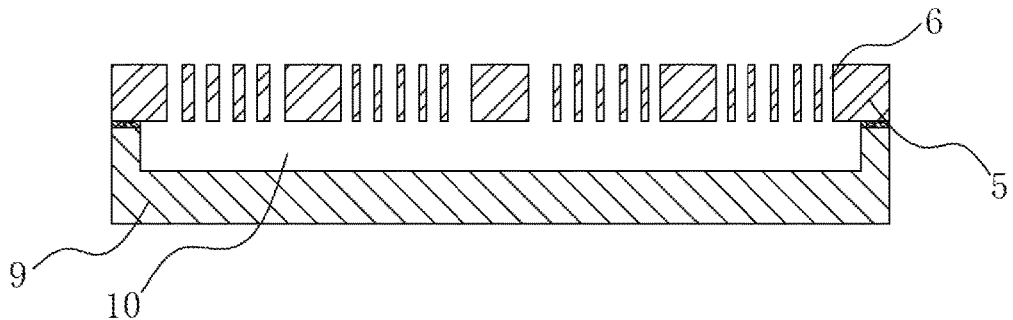
FIG. 2a to FIG. 2c illustrate a process flow for forming an inertia sensor according to an embodiment of the present invention.
Figure 2B:
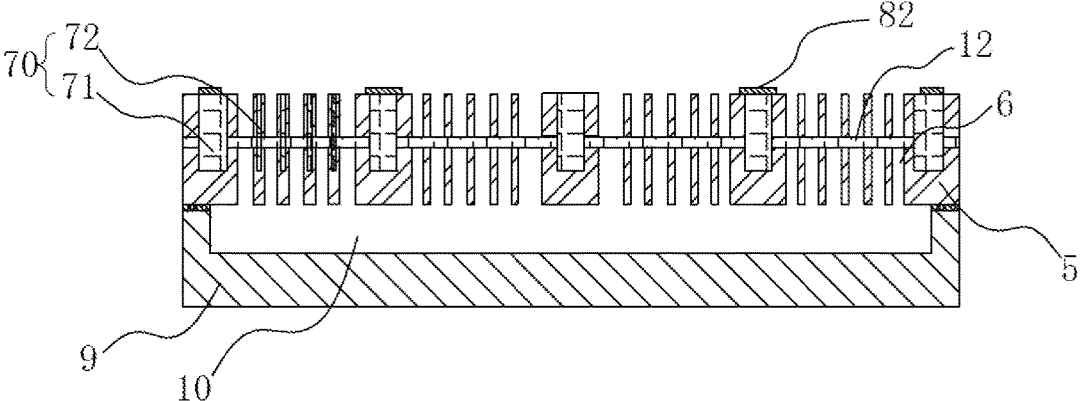
Figure 2C:
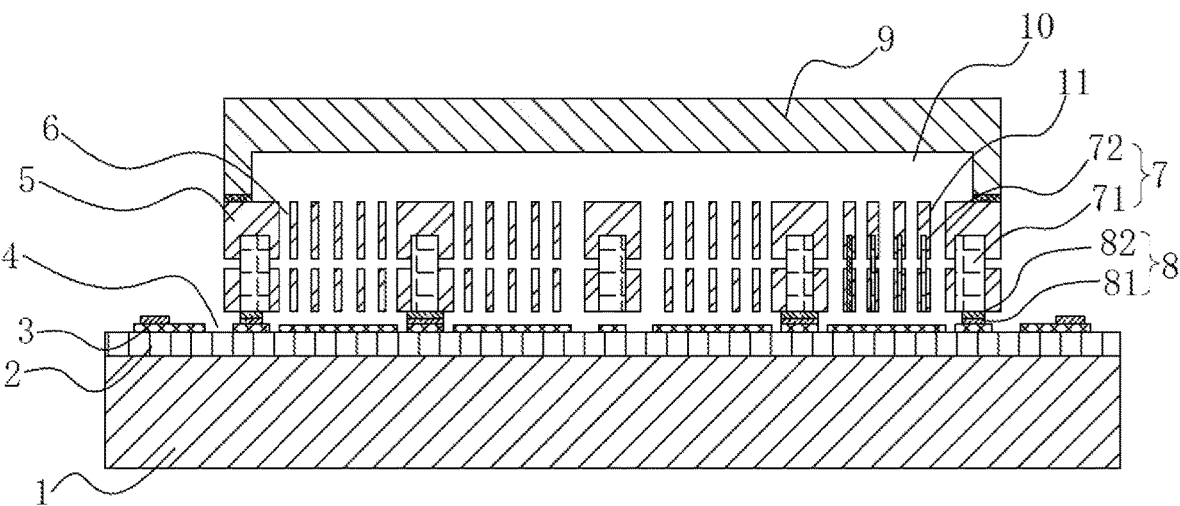

Based on the embodiments described above, as shown in FIG. 2a to FIG. 2c, the present invention further provides a method for forming the inertia sensor described above. The method includes the following steps.

At step S101, the second electric-conductive layer 5 is formed on the second substrate 9, and the second openings 6 are formed in the second electric-conductive layer 5.

At this step, a resist layer is formed on a bottom surface of the second substrate 9, the resist layer is patterned by a photolithography process to form a mask, and the second substrate 9 is etched through the mask to form a recess 10. The second electric-conductive layer 5 is formed by deposition on the second substrate 9, and the resist layer is deposited at a surface of the second electric-conductive layer 5. The resist layer is patterned by a photolithography process to form a mask, and the second electric-conductive layer 5 is etched through the mask to form second openings 6 penetrating through the second electric-conductive layer 5.

At step S102, a sacrificial layer 12 is deposited on the second electric-conductive layer 5;

At this step, the sacrificial layer 12 may be formed by PSG. By depositing the sacrificial layer 12 with a certain thickness, and then removing the sacrificial layer 12, a gap is formed between two second electric-conductive layers 5.

At step S103, the second electric-conductive layer 5 is formed on the sacrificial layer 12, and the first openings 4 are formed in the second electric-conductive layer 5.

In this embodiment of the present invention, two second electric-conductive layers 5 are provided. Those skilled in the art should know that more than two second electric-conductive layers 5 can be provided, which is not limited herein. At this step, the resist layer is formed by depositing at a surface of the second electric-conductive layer 5. The resist layer is patterned by a photolithography process to form a mask, and the second electric-conductive layer 5 is etched through the mask to form second openings 6 penetrating through the second electric-conductive layer 5.

At step S104, adjacent second electric-conductive layers 5 are connected to each other by a connection part 7.

At this step, the first connector 71 and the second connector 72 fix the two adjacent second electric-conductive layers 5 by bonding. The first connectors 71 are spaced apart from one another and are arranged with an axis of the second electric-conductive layer 5 as a center. The second connectors 72 are arranged at an edge of the second electric-conductive layer 5, and are located between two first connectors 71.

At step S105, the second bonding layer 82 is formed on the second electric-conductive layer 5.

At this step, the second bonding layer 82 is formed at a surface of the second electric-conductive layer 5 by, for example, deposition and etching.

At step S106, the medium layer 2 and the first electric-conductive layer 3 are formed on the first substrate 1, and the first openings 4 are formed in the first electric-conductive layer 3.

At this step, the medium layer 2 is formed by deposition on the first substrate 1, the first electric-conductive layer 3 is formed by deposition on the medium layer 2, and the resist layer is formed by deposition at a surface of the first electric-conductive layer 3. The resist layer is patterned by a photolithography process to form a mask, and the first electric-conductive layer 3 is etched through the mask to form the first openings 4 penetrating through the first electric-conductive layer 3.

At S107, the first bonding layer 81 is formed on the first electric-conductive layer 3.

At this step, the first bonding layer 81 is formed at the surface of the first electric-conductive layer 3 by, for example, deposition and etching.

At step S108: the first bonding layer 81 is bonded to the second bonding layer 82 at a high temperature, and a closed space is formed between the second substrate 9 and the first substrate 1.

At step S109, the sacrificial layer 12 is removed.

The structures, features and effects of the present invention have been described in detail above based on the embodiments shown in the drawings. It should be noted that the embodiments described above are merely preferred embodiments of the present invention, which do not limit a scope of the present invention. Any modifications, equivalent substitutions and improvements made within the principle of the present disclosure shall fall into the protection scope of the present disclosure.

What is claimed is:

1. An inertia sensor and a method for forming the inertial sensor, from bottom of the inertia sensor to top of the inertia sensor, the inertia sensor successively comprising:
   a first substrate, wherein the first substrate has a circular shape;
   a medium layer stacked on the first substrate;
   a first electric-conductive layer having a circular shape stacked on the medium layer, wherein first openings are formed in the first electric-conductive layer, and the first openings are spaced apart from one another and are arranged along a radial direction of the first electric-conductive layer;
   second electric-conductive layers having a circular shape, wherein the second electric-conductive layers are bonded to the first electric-conductive layer through bonding structures from bottom to top; wherein a gap is formed between adjacent ones of the second electric-conductive layers, and adjacent ones of the electric-conductive layers are connected to each other by a connection part; and wherein second openings are formed in each of the second electric-conductive layers, and the second openings are spaced apart from one another and are arranged along a radial direction of each of the second electric-conductive layers; and
   a second substrate covering the first substrate, wherein a closed space is formed between the second substrate and the first substrate and the second substrate has a circular shape;

and wherein the method comprises:

forming one of the second electric-conductive layers on the second substrate, and forming the second openings in the second electric-conductive layer;

depositing a sacrificial layer on the one of the second electric-conductive layers;

forming another one layer of the second electric-conductive layers on the sacrificial layer, and forming the second openings in the another one of the second electric-conductive layers;

connecting the one layer of the second electric-conductive layers and the another one layer of the second electric-conductive layers with the connection part;

forming a second bonding layer on the second electric-conductive layers;

forming the medium layer and the first electric-conductive layer on the first substrate, and forming the first openings in the first electric-conductive layer;

forming a first bonding layer on the first electric-conductive layer;

removing the sacrificial layer; and bonding the first bonding layer and the second bonding layer together at a high temperature, and forming a closed space between the second substrate and the first substrate;

wherein the connection part comprises first connectors, the first connectors are spaced apart from one another and are arranged along a radial direction of each of the second electric-conductive layers, and two ends of each of the first connectors are connected to two adjacent ones of the second electric-conductive layers;

wherein positions of the first connectors correspond to positions of the bonding structures, respectively.

2. The inertia sensor as described in claim 1, wherein connection part further comprises second connectors, the second connectors are spaced apart from one another and are arranged along a radial direction of each of the second electric-conductive layers, two ends of each of the second connectors are connected to two adjacent ones of the second electric-conductive layers, and a width of each of the second connectors is smaller than a width of each of the first connectors.

3. The inertia sensor as described in claim 2, wherein the second connectors are arranged adjacent to an edge of the second electric-conductive layers.

4. The inertia sensor as described in claim 2, wherein each of the first connectors and the second connectors is formed by a conductive material.

5. The inertia sensor as described in claim 2, wherein the connection part is bonded and fixed to the second electric-conductive layers.

6. The inertia sensor as described in claim 1, wherein the bonding structures comprise a first bonding layer and a second bonding layer that are bonded to each other, the first bonding layer is stacked at a top of the first electric-conductive layer, and the second bonding layer is stacked at a bottom of the second electric-conductive layers.

7. The inertia sensor as described in claim 1, wherein a surface of the second substrate facing the first substrate is recessed to form a recess.

8. A method for forming an inertial sensor, from bottom of the inertia sensor to top of the inertia sensor, the inertia sensor successively comprising:

a first substrate, wherein the first substrate has a circular shape;

a medium layer stacked on the first substrate;

a first electric-conductive layer having a circular shape stacked on the medium layer, wherein first openings are formed in the first electric-conductive layer, and the first openings are spaced apart from one another and are arranged along a radial direction of the first electric-conductive layer;

second electric-conductive layers having a circular shape, wherein the second electric-conductive layers are bonded to the first electric-conductive layer through bonding structures from bottom to top; wherein a gap is formed between adjacent ones of the second electric-conductive layers, and adjacent ones of the electric-conductive layers are connected to each other by a connection part; and wherein second openings are formed in each of the second electric-conductive layers, and the second openings are spaced apart from one another and are arranged along a radial direction of each of the second electric-conductive layers; and a second substrate covering the first substrate, wherein a closed space is formed between the second substrate and the first substrate and the second substrate has a circular shape;

and wherein the method comprises:

forming one of the second electric-conductive layers on the second substrate, and forming the second openings in the second electric-conductive layer;

depositing a sacrificial layer on the one of the second electric-conductive layers;

forming another one layer of the second electric-conductive layers on the sacrificial layer, and forming the second openings in the another one of the second electric-conductive layers;

connecting the one layer of the second electric-conductive layers and the another one layer of the second electric-conductive layers with the connection part;

forming a second bonding layer on the second electric-conductive layers;

forming the medium layer and the first electric-conductive layer on the first substrate, and forming the first openings in the first electric-conductive layer;

forming a first bonding layer on the first electric-conductive layer;

removing the sacrificial layer; and bonding the first bonding layer and the second bonding layer together at a high temperature, and forming a closed space between the second substrate and the first substrate.

* * * * *